United States Patent [19]

Tihanyi et al.

[11] Patent Number: 4,561,003
[45] Date of Patent: Dec. 24, 1985

[54] FIELD EFFECT TRANSISTOR

[75] Inventors: Jenö Tihanyi; Jens P. Stengl, both of Munich, Fed. Rep. of Germany

[73] Assignee: Siemens Aktiengesellschaft, Berlin and Munich, Fed. Rep. of Germany

[21] Appl. No.: 600,192

[22] Filed: Apr. 13, 1984

Related U.S. Application Data

[63] Continuation of Ser. No. 245,033, Mar. 18, 1981.

[30] Foreign Application Priority Data

Mar. 28, 1980 [DE]  Fed. Rep. of Germany ....... 3012185

[51] Int. Cl.$^4$ ........................................... H01L 29/78
[52] U.S. Cl. ................................ 357/23.4; 357/23.14; 357/41; 357/20
[58] Field of Search ................. 357/23.4, 23.14, 23 R, 357/20, 41

[56] References Cited

U.S. PATENT DOCUMENTS

| | | | |
|---|---|---|---|
| 3,463,977 | 8/1969 | Grove et al. | 357/53 |
| 3,538,398 | 11/1970 | Whiting | 357/20 |
| 3,845,495 | 10/1974 | Cauge | 357/23.4 |
| 4,015,278 | 3/1977 | Fukuta | 357/23 VD |
| 4,072,975 | 2/1978 | Ishitani | 357/23 VD |
| 4,145,700 | 3/1979 | Jambotkar | 357/41 |
| 4,345,265 | 8/1982 | Blanchard | 357/23.4 |
| 4,376,286 | 3/1983 | Lidow | 357/23.4 |

OTHER PUBLICATIONS

"Hexfet: A New High In Power MOS", *Electronic Design*, Jun. 7, 1979.
Yoshida et al., "A High Power MOSFET with a Vertical Drain Electrode and a Meshed Gate Structure", IEEE J. Solid-State Circuits, vol. 5C-11, No. 4, pp. 472-477, Aug. 1976.
Grove, A. S., "Physics and Technology of Semiconductor Devices", John Wiley & Sons, Inc., (1967) pp. 197-198.

*Primary Examiner*—Martin H. Edlow
*Attorney, Agent, or Firm*—Herbert L. Lerner; Laurence A. Greenberg

[57] ABSTRACT

Field effect transistor, including negatively and positively doped zones in the form of a substrate of a given first conductivity type having a surface, a first zone of a second conductivity type being opposite the first given conductivity type and embedded planar in the substrate, a second zone of the first conductivity type being embedded planar in the first zone, a first p-n junction disposed between the first and second zones, a second p-n junction disposed between the first zone and the substrate, both of the p-n junctions emerging to the surface of the substrate, at least one channel zone disposed between the p-n junctions, and a gate electrode at least covering the channel zone and being insulated from the surface of the substrate, at least the second p-n junction at least in the vicinity of the channel zone adjoining a given negatively doped zone at the surface of the substrate at an angle of at most 180° to the given negatively doped zone.

7 Claims, 8 Drawing Figures

FIELD EFFECT TRANSISTOR

This application is a continuation of application Ser. No. 245,033, filed Mar. 18, 1981.

The invention relates to a field effect transistor with a substrate of a first conductivity, a first zone of a second conduction type which is embedded planar in the substrate, and a second zone of a first conduction type which is embedded planar in the first zone, wherein the p-n junctions between the first and the second zone and between the first zone and the substrate, respectively, emerge at the substrate surface, and including at least one channel zone located between the p-n junctions, and a control or gate electrode which at least covers the channel zone and is insulated from the substrate surface.

Such field effect transistors have already been described in the prior art. The p-n junction therein located between the first zone and the substrate is biased in the cut-off direction if a voltage poled in the conducting direction is applied between the source and the drain. Because of the curvature of the space charge zone between the first zone and the substrate which exists due to the application of the planar technique, the field intensity is increased at the curvatures, which causes multiplication of the charge carriers. The multiplication in the substrate is unavoidable in principle and leads to a steep rise of the transistor current with increasing voltage.

If the p-n junction biased in the cut-off direction is, in addition, poorly constructed at the surface in the vicinity of the channel zone, i.e., of the inversion layer, then excessive multiplication can also occur in the vicinity of the substrate surface and cause a steep rise of the current through the field effect transistor. This rise always occurs at voltage values which are lower than those at which the rise in the interior of the substrate would occur. A poor construction is one in which the surface of the device, in vicinity of the corners or in vicinity of sharp bends of a planar zone, has a greater field intensity that locations at which the pn-junction is straight. The steep current increase occurs in vicinity of the edges.

It is accordingly an object of the invention to provide an FET which overcomes the hereinafore-mentioned disadvantages of the heretofore-known devices of this general type, and to do so in such a manner that the steep current rise at the substrate surface occurs only at voltage values which at least closely approximate those for a steep rise in the interior of the substrate.

With the foregoing and other objects in view there is provided, in accordance with the invention, a field effect transistor, comprising n and p doped zones in the form of a substrate of a given first conductivity type having a surface, a first zone of a second conductivity type being opposite the first given conductivity type and embedded planar in the substrate, a second zone of the first conductivity type being embedded planar in the first zone, a first p-n junction disposed between the first and second zones, a second p-n junction disposed between the first zone and the substrate, both of the p-n junctions emerging to the surface of the substrate, at least one channel zone disposed between the p-n junctions, and a gate electrode at least covering the channel zone and being insulated from the surface of the substrate, at least the second p-n junction at least in the vicinity of the channel zone adjoining a given negatively doped zone at the surface of the substrate at an angle of at most 180°, i.e. toward or on the side of, the given n doped zone.

In an FET with an n-conduction channel, the n doped zone is the substrate and in an FET with a p-conduction type channel, it is the first zone. "Channel zone" is understood to mean that zone, in which an inversion zone develops at the surface of the first zone if a control voltage is applied to the control electrode.

In accordance with another feature of the invention, the substrate is of an n-conducting type, the first zone is of a p-conducting type, the second zone is of an n-conducting type, the first p-n junction has the shape of a polygon, the second p-n junction has sections being parallel to the first p-n junction, and the channel zone is formed between the sections and sides of the polygon.

In accordance with a further feature of the invention, the number of the channel zones is equal to the number of sides of the polygon.

In accordance with an added feature of the invention, there are provided regions of the first zone being opposite the corners of the polygon, the regions having a greater width than the channel zone.

In accordance with an additional feature of the invention, the regions of the first zone are more highly doped than the channel zone.

In accordance with again another feature of the invention, the first zone is in the form of a multiplicity of first zones and the polygon is in the form of a multiplicity of polygons, and there are provided bridge regions of the first zone on the corners of the polygons having the same conductivity type as the first zone and connecting the corners to each other.

In accordance with again a further feature of the invention, the bridge regions are more heavily doped than the channel zone.

In accordance with again an added feature of the invention, the polygons are rectangles disposed in a regular rectangle, and the adjacent corners of four of the rectangles are conncted to each by the bridge regions, the bridge regions being crossed in X-fashion forming a coherent zone.

In accordance with again an additional feature of the invention, the polygon is in the form of a multiplicity of regular hexagons, at least three of the hexagons are disposed in a regular triangle, and the regions are in the form of bridges connecting opposite corners of the three hexagons to each other.

In accordance with yet another feature of the invention, the bridges are connected to each other in star-fashion.

In accordance with yet an added feature of the invention, the substrate is of an n-conducting type, the first zone is of a p-conducting type, and the second zone is of an n-conducting type, the first zone having openings formed therein through which the substrate is exposed in the form of islands, and the gate electrode covers the islands, the second zone being jointly assigned to a plurality of adjacent zones, and the first p-n junction being opposite a part of the second p-n junction.

In accordance with yet an additional feature of the invention, the islands are regularly disposed polygons.

In accordance with still another feature of the invention, the islands are regularly disposed conic sections.

In accordance with a concomitant feature of the invention, the substrate is of a p-conducting type, the first zone is of an n-conducting type, and the second zone is of a p-conducting type, the first zone being in the form of an island in the substrate, and the channel zone occupies the entire periphery of the island.

Other feature which are considered as characteristic for the invention are set forth in the appended claims.

Although the invention is illustrated and described herein as embodied in a field effect transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
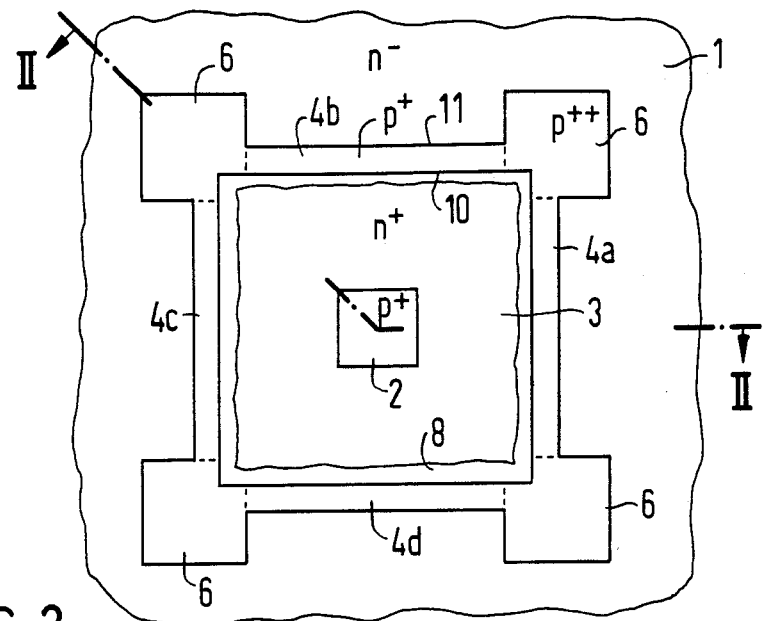
FIG. 1 is a fragmentary diagrammatic top plan view, partly broken away, of a first embodiment example of a vertical MIS FET with an n-conducting type channel.
Figure 2:
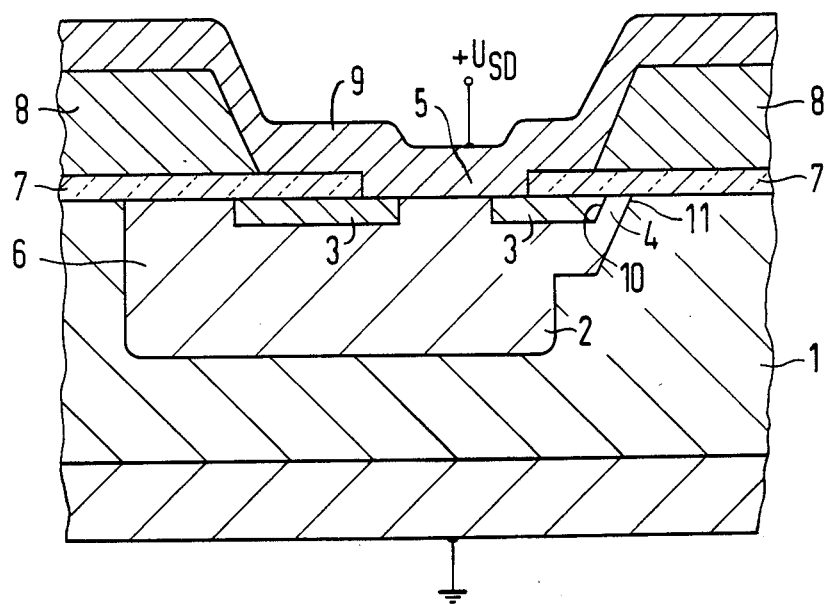
FIG. 2 is a cross-sectional view through the FET according to FIG. 1, taken along the line II—II therein, in the direction of the arrows.

Referring now to the figures of the drawing and first particularly to FIGS. 1 and 2 thereof, it is seen that a portion from a vertical MIS FET is shown which is disposed on an n-conductivity type substrate 1. In this substrate which forms the drain of the FET, a first zone 2 with p-conductivity type is embedded. This zone has a channel 4 of the same conduction type, which is prepared by ion implantation. The channel 4 is doped relatively weakly. The zone 2 itself is usually diffused-in and is doped relatively heavily. A second zone 3 (the source) of the first conduction type (n-conduction) is embedded into the first zone 2. The second zone 3 may be implanted or diffused. The substrate surface is covered with an insulating layer 7 of silicon dioxide $SiO_2$, for instance, and leaves only a contact hole 5 free. On the insulating layer 7 there is a gate electrode 8, which may be formed of highly-doped polycrystalline silicon. The gate electrode 8 has a bevelled side and serves as a mask in the implantation of the channel zone 4 and, if applicable, of the zone 3. The control or gate electrode 8 is shown as being transparent in FIG. 1 for the sake of greater clarity; only its inner edge, lying on the second zone 3, is visible. The insulating layer 7 has been omitted altogether in FIG. 1 for greater clarity of presentation.

The p-n junction 10 is situated between the second zone 3 and the channel zone 4.

The channel zone 4 is situated between the p-n junction 10 and a p-n junction 11 which is disposed between the first zone 2 and the substrate 1. The p-n junctions are parallel to each other at the substrate surface and are straight. The channel zone is subdivided into four sections 4a, 4b, 4c and 4d, between each of which there is disposed a heavily doped zone 6. This region 6 is part of the first zone 2. The region 6 is contiguous with the channel zone 4 and also has the same conductivity type as the latter, but is more heavily doped.

If a voltage is applied to the FET in the conducting direction, this means that the polarity of zone 2 is more negative and the substrate 1 more positive. A space charge zone is then developed on both sides of the p-n junction 11. This space charge zone follows approximately the shape of the p-n junctions 10 and 11 at the surface. On the side of the n doped zone, the substrate 1, the edge 11 adjoins the substrate under an angle of 180°. Thus, an increase of the field intensity cannot occur at any point of the channel zone 4a to 4d. The charge carrier multiplication at the surface is therefore greatly reduced and is at least brought close to the values in the interior of the substrate. Furthermore, if a control voltage is applied, no inversion layer develops in the regions 6 because the doping of the regions 6 is much heavier than that of the channel zone 4. In addition, the width of the regions 6 is much larger. Therefore, no current can flow in the region 6 and charge carrier multiplication does not take place.

To obtain more power, it is advantageous to integrate a large number of the cells shown in FIGS. 1 and 2 and to connect them in parallel. The zones 2 and 3 of all cells can be connected by a metal layer 9, while the substrate 1 is provided with a largearea metal electrode. To save space, the structures can be packed so tightly that the adjacent regions 6 of four cells disposed in a square configuration form a single cell.

Figure 3:
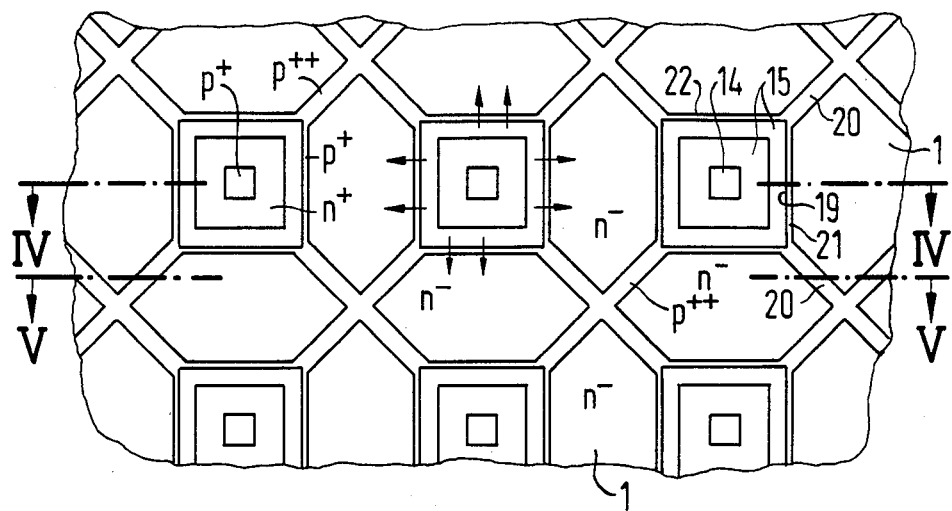
FIG. 3 is a top plan view similar to FIG. 1, of a further embodiment example with an n-conduction type channel.
Figure 4:
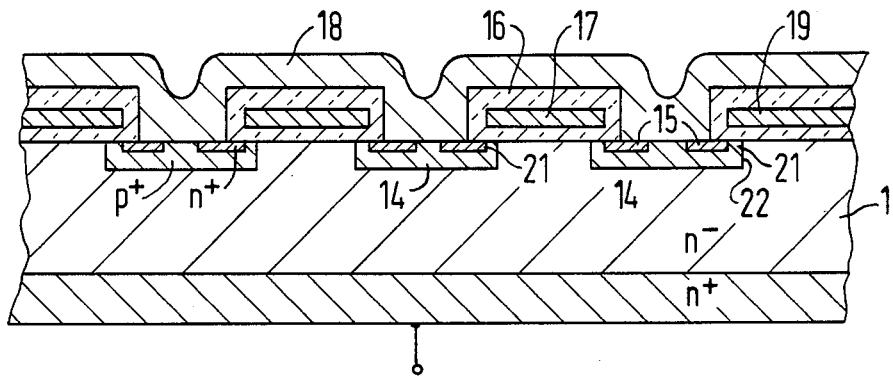
FIGS. 4 and 5 are cross-sectional views through the embodiment example according to FIG. 3 taken along the lines IV—IV and V—V, respectively, therein, in the direction of the arrows.
Figure 5:
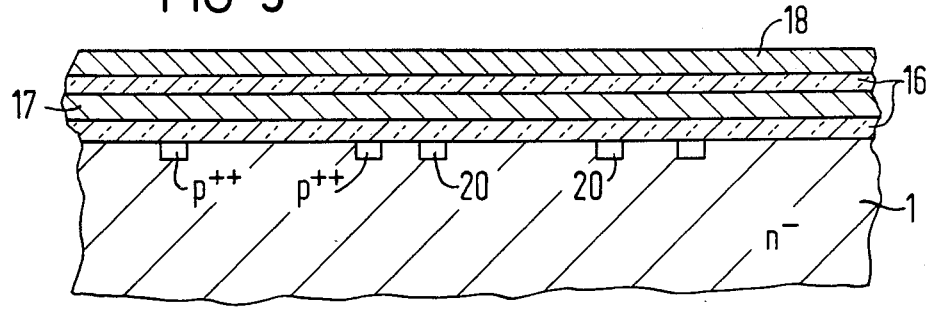

In FIGS. 3 to 5, a variant of the FET according to FIGS. 1 and 2 is shown. In the n-conduction type substrate 1, first p-conduction type zones 14 are embedded, such as by planar diffusion. The first zones 14 have a square shape but can also be rectangular. Second (source) zones which are of n-conduction type are embedded into these first zones. The zones 15 can be made by planar diffusion or ion implantation. The p-n junction between the first zone 14 and the substrate 1 is designated with reference numeral 22. Between the edge 22 and the second zone 15 there is a channel zone 21. To prevent the increase in the field intensity explained in connection with FIGS. 1 and 2 between the n-doped substrate and the p-doped zone 14 in the vicinity of the channel zone 21, the zone 14 ends at the corners in relatively highly doped bridges 20. These bridges 20 have the same function as the regions 6 of the FET according to FIG. 1. If, as in the embodiment example according to FIG. 3, a multiplicity of zones 14 is arranged in the form of regular squares, then the respective corners of the zones 14 are connected to each other by two crossing bridges 20. These bridges 20 then form a single contiguous zone.

In the vicinity of the corners of the zone 14, the doping between the zone 15 and the substrate 1 is so high that no inversion layer can develop there if a control voltage is applied. Therefore, current also does not flow there and charge carrier multiplication at the corners is avoided.

In FIG. 4, the control electrode is designated with reference numeral 19 and preferably is formed of highly doped polycrystalline silicon. The electrode 19 covers the second zones 14 at least in the vicinity of the channel zones 21. Coverage of the bridges 20 does no harm.

The control electrode 17 is insulated from the substrate surface by an insulating layer 16, formed of silicon dioxide $SiO_2$, for instance. The insulating layer 16 leaves contact openings free, through which the first zone 14 and the second zones 15 are provided with contacts by way of a metal layer 18. In FIG. 3, the control electrode 17 and the insulating layer 16 as well as the metal layer 18 are omitted for the sake of greater clarity of presentation. Only the edge 19 of the control electrode 17 is shown.

Figure 6:
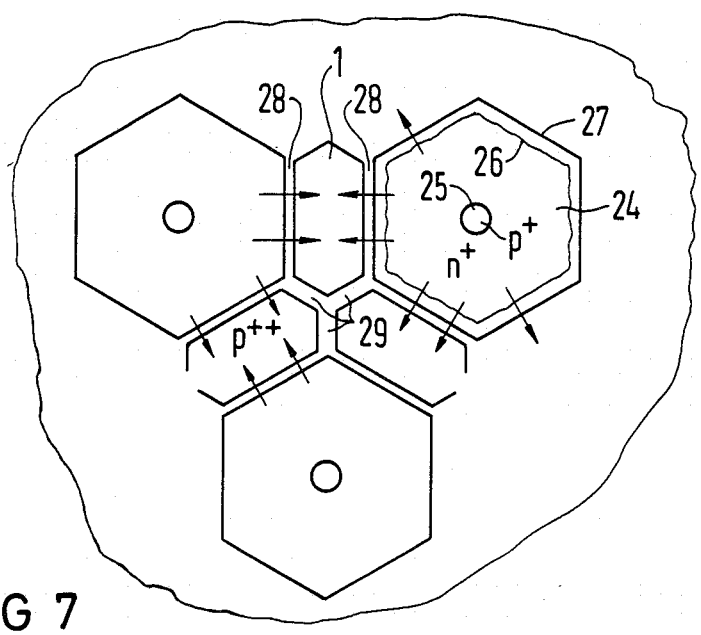
FIG. 6 is a top plan view similar to FIGS. 1 and 6, of a third embodiment example of an FET with an n-conduction type channel.

In FIG. 6, a particularly space-saving embodiment example of an FET is shown. First p-conduction type zones are embedded in an n-conduction type substrate (drain) 1. Into these first zones, second (source) zones 24 of regular hexagonal shape are embedded. The latter have openings 25 in the center thereof, through which a part of the first p-zone is visible from the top. Parts of the first zone are also the channel zones 28 which are of the p-conducting type like the first zones. The edges between the second zones 24 and the channel zones 28 are designated with reference numeral 27. They are straight. The corners of three respective hexagonal first zones, arranged in the form of a triangle, are connected by bridges 29, which are heavily p-doped. These bridges 29 together form a three-beam, star-like or Y-shaped zone which is preferably heavily p-doped. This zone prevents charge carrier multiplication in the vicinity of the corners at the substrate surface. A large part of the hexagonal cells are covered by a control electrode which is insulated from the substrate surface, and the edge of which is designated with reference numeral 26. Otherwise, neither the insulating layer nor the control electrode are shown. In the operation of the FET shown, current can flow only at the straight edges, as indicated by the arrows. Current flow through the corners of the hexagons is prevented since there, the region 29 is substantially wider and more heavily doped than the channel zone 28 and an inversion zone can therefore not develop. In FIG. 6, only three cells are shown. For larger units, a correspondingly greater number of cells must be connected in parallel.

Figure 7:
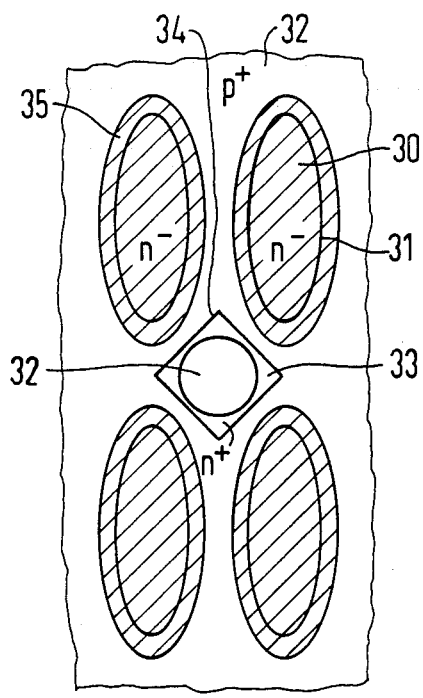
FIG. 7 is another top plan view of a fourth embodiment example of an FET with n-conduction type channel.

In FIG. 7, another advantageous embodiment is shown which differs from the preceding ones in that here, the p-doped first zone in contiguous and has openings through which the substrate emerges to the surface in islands 30. These islands, or their p-n junctions 31 emerging to the substrate surface may have the form of self-enclosed conic sections or polygons. The islands 30 are covered by control electrodes 35 which extend beyond the p-n junctions 31 and are insulated from the substrate surface. The control electrodes are shown hatched in FIG. 7 for better visibility. With some adjacent islands 30 (four in the example) a second zone 33 is associated which is sunk into the first zone 32. The zone 33 is heavily n-doped. Within the second zone 33, the first zone 32 comes to the surface. If voltage is applied in the conducting direction, the n-doped substrate is at positive polarity and the p-doped zone 32 is at negative polarity. The field is directed with respect to the islands 30 from the inside out, with the field lines diverging. Thus, reduction of the field intensity even takes place in this embodiment as compared to a channel zone bounded by straight edges.

Figure 8:
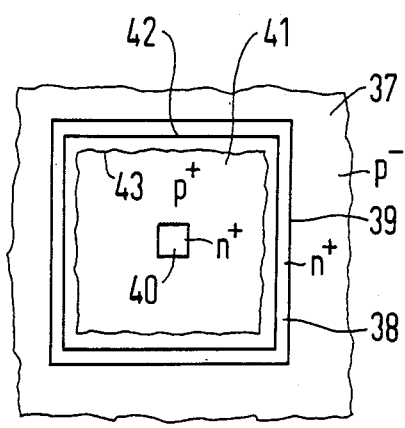
FIG. 8 is a top plan view of an embodiment example of an FET with a p-conduction type channel.

In FIG. 8, an FET with a p-conduction type channel is shown. The substrate 37 is of a weakly p-conducting type, the first zone 40 embedded therein is heavily of a n-conducting type, and the second zone 41 embedded in this first zone is of a heavily p-conducting type. The p-n junctions are designated with reference numerals 39 and 42. The zones are square-shaped; however, they may also have a polygonal shape or the form of closed conic sections. If a voltage is applied in the conducting direction, the channel zone 38 is at positive potential, while the substrate 37 is at negative potential. The field lines are directed in this embodiment from the inside out, so that likewise a reduction of the electric field intensity at the corners takes place.

There are claimed:

1. Field effect transistor, comprising a substrate of a given first conductivity type having a surface, a first zone of a second conductivity type embedded planar in said substrate, a second zone of said first conductivity type being embedded planar in said first zone, a first p-n junction mutually bordering said first and second zones, a second p-n junction mutually bordering said first zone and said substrate, both of said p-n junctions emerging to said surface of said substrate, at least one channel zone disposed between said p-n junctions, and a gate electrode at least covering said channel zone and being insulated from said surface of said substrate, wherein said channel zone is subdivided into straight sections, and said first zone includes regions of said second conductivity type being part of said first zone, said regions being more highly doped than said sections of said channel zone and being disposed between said sections of said channel zone forming a contiguous structure with said sections.

2. Field effect transistor according to claim 1, wherein said regions of said first zone have a greater width than said sections of said channel zone.

3. Field effect transistor according to claim 1, wherein said first zone is in the form of a multiplicity of first zones and said contiguous structure is in the form of a multiplicity of structures, and including bridge regions, said bridge regions having the same conductivity type as said first zones, being more heavily doped than said sections of said channel zone, being embedded in said substrate and connecting said sections of said channel zones to each other.

4. Field effect transistor according to claim 3, wherein said contiguous structures are rectangles disposed in a regular rectangle, and the adjacent corners of four of said rectangles are connected to each other by said bridge regions, said bridge regions being crossed in X-fashion forming a coherent zone.

5. Field effect transistor according to claim 3, wherein said contiguous structures is in the form of a multiplicity of regular hexagons, at least three of said hexagons are disposed in a regular triangle, and said regions are in the form of bridges connecting opposite corners of said three hexagons to each other.

6. Field effect transistor according to claim 5, wherein said regions of said first zone are more highly doped than said channel zone.

7. Field effect transistor according to claim 5, wherein said bridges are connected to each other in the shape of a Y.

* * * * *